United States Patent
Kumar et al.

(10) Patent No.: US 9,252,392 B2
(45) Date of Patent: Feb. 2, 2016

(54) THIN FILM ENCAPSULATION-THIN ULTRA HIGH BARRIER LAYER FOR OLED APPLICATION

(71) Applicant: Applied Materials, Inc., Santa Clara, CA (US)

(72) Inventors: Bhaskar Kumar, Santa Clara, CA (US); Dieter Haas, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 35 days.

(21) Appl. No.: 14/203,426

(22) Filed: Mar. 10, 2014

(65) Prior Publication Data

US 2014/0264297 A1 Sep. 18, 2014

Related U.S. Application Data

(60) Provisional application No. 61/785,171, filed on Mar. 14, 2013.

(51) Int. Cl.
| | |
|---|---|
| H01L 35/24 | (2006.01) |
| H01L 51/00 | (2006.01) |
| H01L 51/40 | (2006.01) |
| H01L 21/31 | (2006.01) |
| H01L 21/469 | (2006.01) |
| H01L 51/52 | (2006.01) |

(52) U.S. Cl.
CPC .................... *H01L 51/5253* (2013.01)

(58) Field of Classification Search
CPC ...................... H01L 21/02274; H01L 51/5256
USPC ........................ 257/40; 438/99, 785
See application file for complete search history.

(56) References Cited

U.S. PATENT DOCUMENTS

| | | | |
|---|---|---|---|
| 2003/0207593 A1 | 11/2003 | Derderian et al. | |
| 2008/0299288 A1 | 12/2008 | Kobrin et al. | |
| 2012/0028478 A1 | 2/2012 | Gordon et al. | |
| 2012/0201860 A1 | 8/2012 | Weimer et al. | |
| 2015/0203707 A1* | 7/2015 | Klun | C08J 7/045 428/412 |
| 2015/0221891 A1* | 8/2015 | Ghosh | H01L 51/5256 257/40 |
| 2015/0249229 A1* | 9/2015 | Song | H01L 51/5253 257/40 |

FOREIGN PATENT DOCUMENTS

KR 10-2009-0083404 3/2011

* cited by examiner

*Primary Examiner* — David S Blum
(74) *Attorney, Agent, or Firm* — Patterson & Sheridan, LLP

(57) ABSTRACT

A method and apparatus for depositing a multilayer barrier structure is disclosed herein. In one embodiment, a thin barrier layer formed over an organic semiconductor includes a non-conformal organic layer, an inorganic layer formed over the non-conformal organic layer, a metallic layer formed over the inorganic layer and a second organic layer formed over the metallic layer. In another embodiment, a method of depositing a barrier layer includes forming an organic semiconductor device over the exposed surface of a substrate, depositing an inorganic layer using CVD, depositing a metallic layer comprising one or more metal oxide or metal nitride layers over the inorganic layer by ALD, each of the metal oxide or metal nitride layers comprising a metal, wherein the metal is selected from the group consisting of aluminum, hafnium, titanium, zirconium, silicon or combinations thereof and depositing an organic layer over the metallic layer.

20 Claims, 3 Drawing Sheets

THIN FILM ENCAPSULATION-THIN ULTRA HIGH BARRIER LAYER FOR OLED APPLICATION

CROSS-REFERENCE TO RELATED APPLICATIONS

This application claims benefit of U.S. Provisional Patent Application Ser. No. 61/785,171 (APPM/20582USL), filed Mar. 14, 2013, which is herein incorporated by reference.

BACKGROUND OF THE INVENTION

1. Field of the Invention

Embodiments disclosed herein generally relate to the deposition of a multilayer ultra thin film barrier. More particularly, embodiments generally relate to methods for depositing barrier layers with low permeability onto one or more features.

2. Description of the Related Art

Organic semiconductor devices, such as organic light emitting diodes (OLED), are used in the manufacture of television screens, computer monitors, mobile phones, other hand-held devices, or other devices for displaying information. A typical OLED may include layers of organic material situated between two electrodes that are all deposited on a substrate in a manner to form a matrix display panel having individually energizable pixels. The OLED is generally placed between two glass panels, and the edges of the glass panels are sealed to encapsulate the OLED therein.

The encapsulation is achieved by sealing the active materials in inert atmosphere using a glass lid secured by a bead of UV-cured epoxy resin. The rigid encapsulation is not applicable to flexible displays, where a durable and flexible encapsulation is necessary to protect the active OLED materials from water moisture and oxygen. One approach is to use a multilayer barrier structure as a barrier to water moisture and oxygen permeation. Inorganic layers can be incorporated into the multilayer barrier structure as the main barrier layer. Organic layers can also be incorporated for the purposes of stress relaxation and as a water/oxygen diffusion channel decoupling layer.

Though various layers have been incorporated into the encapsulation structure, each of these layers have some level of permeability to the environment. Thus, there is a constant need for improved water-barrier performance in encapsulation/barrier films to protect the devices underneath.

SUMMARY OF THE INVENTION

A method and apparatus for depositing a multilayer barrier structure onto a substrate is described. The multilayer barrier structure can include one or more organic layers, one or more inorganic layers and one or more metallic layers. The metallic layers can comprise two or more metal oxide or metal nitride layers deposited by ALD or plasma enhanced (PE)ALD. By depositing the metallic layer in conjunction with the inorganic layer and the organic layer, better pore sealing can be achieved while maintaining conformal deposition and a reduced risk of thin film peeling.

In one embodiment, a thin barrier layer can include a non-conformal organic layer formed over an organic semiconductor device, an inorganic layer formed over the non-conformal organic layer and comprising a metal oxide, a metal nitride or a metal oxynitride, a metallic layer formed over the inorganic layer comprising one or more metal oxide or metal nitride layers, each metal oxide or metal nitride comprising a metal, and a second organic layer formed over the metallic layer. The metal for each metal oxide or metal nitride layer can be independently selected from the group consisting of Al, Hf, Ti, Zr, or Si.

In another embodiment, a thin barrier layer can include an inorganic layer formed over an organic semiconductor device comprising a metal oxide, a metal nitride or a metal oxynitride, a metallic layer formed over the inorganic layer comprising two or more metal oxide or metal nitride layers, each metal oxide or metal nitride comprising a metal, an organic layer formed over the metallic layer, and a second metallic layer formed over the organic layer comprising one or more metal oxide or metal nitride layers, each metal oxide or metal nitride comprising a metal. The metal for each metal oxide or metal nitride layer can be independently selected from the group consisting of Al, Hf, Ti, Zr, or Si.

In another embodiment, a method of depositing a thin barrier layer can include forming an organic semiconductor device over the exposed surface of a substrate, depositing an inorganic layer comprising a metal oxide, a metal nitride or a metal oxynitride over the substrate with the organic semiconductor device formed thereon using plasma enhanced chemical vapor deposition (PECVD), depositing a metallic layer comprising one or more metal oxide or metal nitride layers over the inorganic layer by atomic layer deposition, each of the metal oxide or metal nitride layers comprising a metal and depositing an organic layer over the metallic layer and the surface of the substrate. The metal for each metal oxide or metal nitride layer can be independently selected from the group consisting of Al, Hf, Ti, Zr, or Si.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

A multilayer barrier stack for use with organic semiconductor devices is described herein. The multilayer barrier stack can include an inorganic layer, a metallic layer and an organic layer. The layers can be deposited over the organic semiconductor device and the substrate in a variety of orders based on the needs of the device. The combination of the inorganic layer, the metallic layer and the organic layer create a very low transmission rate through the layer, as measured by porosity and the water vapor transmission rate. The embodiments disclosed herein are more clearly described with reference to the figures below.

Figure 1:
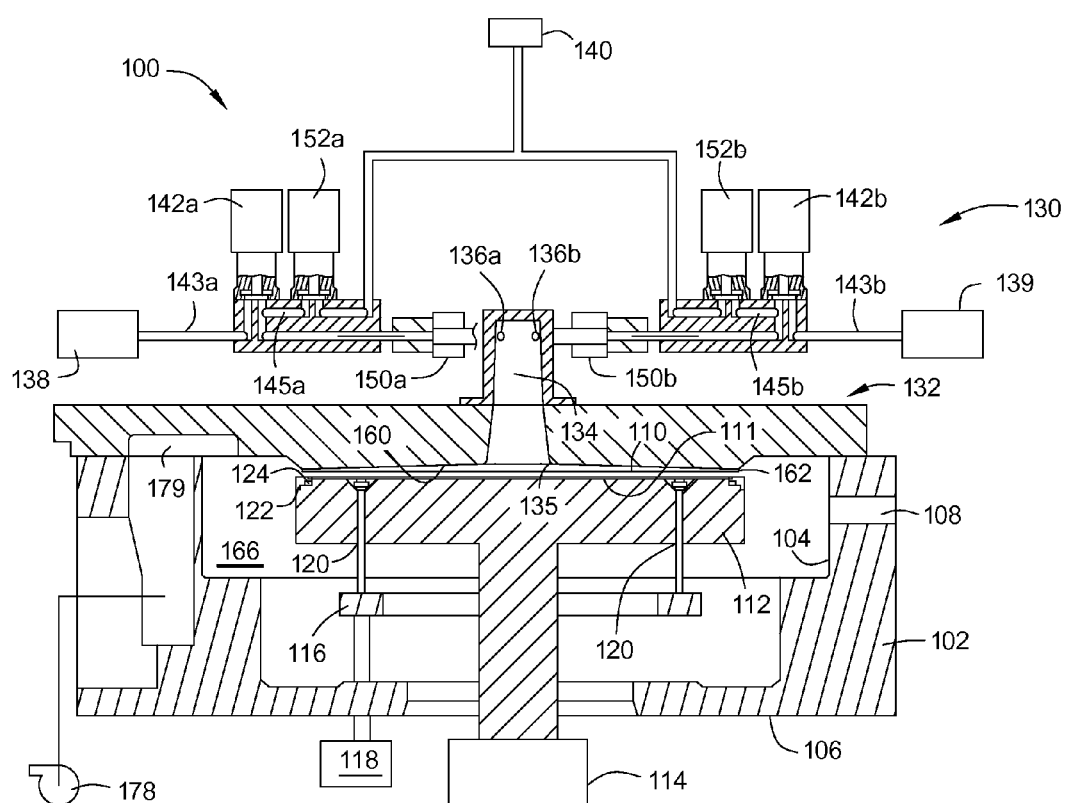
FIG. 1 is a process chamber useable with one or more embodiments.

FIG. 1 is a schematic cross-sectional view of process chamber 200 including a gas delivery system 230 adapted for ALD or sequential layer deposition according to one embodiment. Process chamber 200 contains a chamber body 202 having sidewalls 204 and bottom 206. Slit valve 208 in process chamber 200 provides access for a robot (not shown) to deliver and retrieve substrate 210, such as a 200 mm, 300 mm or greater semiconductor wafer or a glass substrate, to and from process chamber 200.

A substrate support 212 supports substrate 210 on a substrate receiving surface 211 in process chamber 200. Substrate support 212 is mounted to a lift motor 214 to raise and lower substrate support 212 and a substrate 210 disposed thereon. Lift plate 216 connected to lift motor 218 is mounted in process chamber 200 and raises and lowers lift pins 220 movably disposed through substrate support 212. Lift pins 220 raise and lower substrate 210 over the surface of substrate support 212. Substrate support 212 may include a vacuum chuck (not shown), an electrostatic chuck (not shown), or a clamp ring (not shown) for securing substrate 210 to substrate support 212 during processing.

Substrate support 212 can be heated to heat a substrate 210 disposed thereon. For example, substrate support 212 may be heated using an embedded heating element, such as a resistive heater (not shown), or may be heated using radiant heat, such as heating lamps (not shown) disposed above substrate support 212. A purge ring 222 may be disposed on substrate support 212 to define a purge channel 224 which provides a purge gas to a peripheral portion of substrate 210 to prevent deposition thereon.

Gas delivery system 230 can be disposed at an upper portion of chamber body 202 to provide a gas, such as a process gas and/or a purge gas, to process chamber 200. Vacuum system 278 can be in communication with a pumping channel 279 to evacuate any desired gases from process chamber 200 and to help maintain a desired pressure or a desired pressure range inside pumping zone 266 of process chamber 200.

In one embodiment, the gas delivery system 230 contains a chamber lid assembly 232. Chamber lid assembly 232 can include an expanding channel 234 extending from a central portion of chamber lid assembly 232 and a lower surface 260 extending from expanding channel 234 to a peripheral portion of chamber lid assembly 232. Lower surface 260 is sized and shaped to substantially cover substrate 210 disposed on substrate support 212. Expanding channel 234 has gas inlets 236a, 236b to provide gas flows from two similar pairs of valves 242a/252a, 242b/252b, which may be provided together and/or separately.

In one configuration, valve 242a and valve 242b are coupled to separate reactant gas sources but are preferably coupled to the same purge gas source. For example, valve 242a is coupled to reactant gas source 238 and valve 242b is coupled to reactant gas source 239, and both valves 242a, 242b are coupled to purge gas source 240. Each valve 242a, 242b includes a delivery line 243a, 243b and each valves 252a, 252b includes a purge line 245a, 245b. Delivery line 243a, 243b is in fluid communication with reactant gas source 238, 239 and is in fluid communication with gas inlet 236a, 236b of expanding channel 234. Purge line 245a, 245b is in fluid communication with purge gas source 240 and intersects delivery line 243a, 243b downstream of valve seat assembly 244a, 244b of delivery line 243a, 243b. If a carrier gas is used to deliver reactant gases from reactant gas source 238, 239, preferably the same gas is used as a carrier gas and a purge gas (i.e., an argon gas used as a carrier gas and a purge gas). Each valve pair 242a/252a, 242b/252b may be adapted to provide a combined gas flow and/or separate gas flows of the reactant gas and the purge gas.

Delivery lines 243a, 243b of valves 242a, 242b may be coupled to gas inlets 236a, 236b through gas conduits 250a, 250b. Gas conduits 250a, 250b may be integrated or may be separate from valves 242a, 242b. In one aspect, valves 242a, 242b are coupled in close proximity to expanding channel 234 to reduce any unnecessary volume of delivery line 243a, 243b and gas conduits 250a, 250b between valves 242a, 242b and gas inlets 236a, 236b.

Though depicted here as a generic ALD chamber, this is not intended to be limiting of the chambers which may be used with one or more embodiments of the invention. Possible chambers which may be used with one or more embodiments include PECVD, PVD, PEALD or other chambers which are capable of depositing the one or more layers of the multilayer barrier structure.

Figure 2:
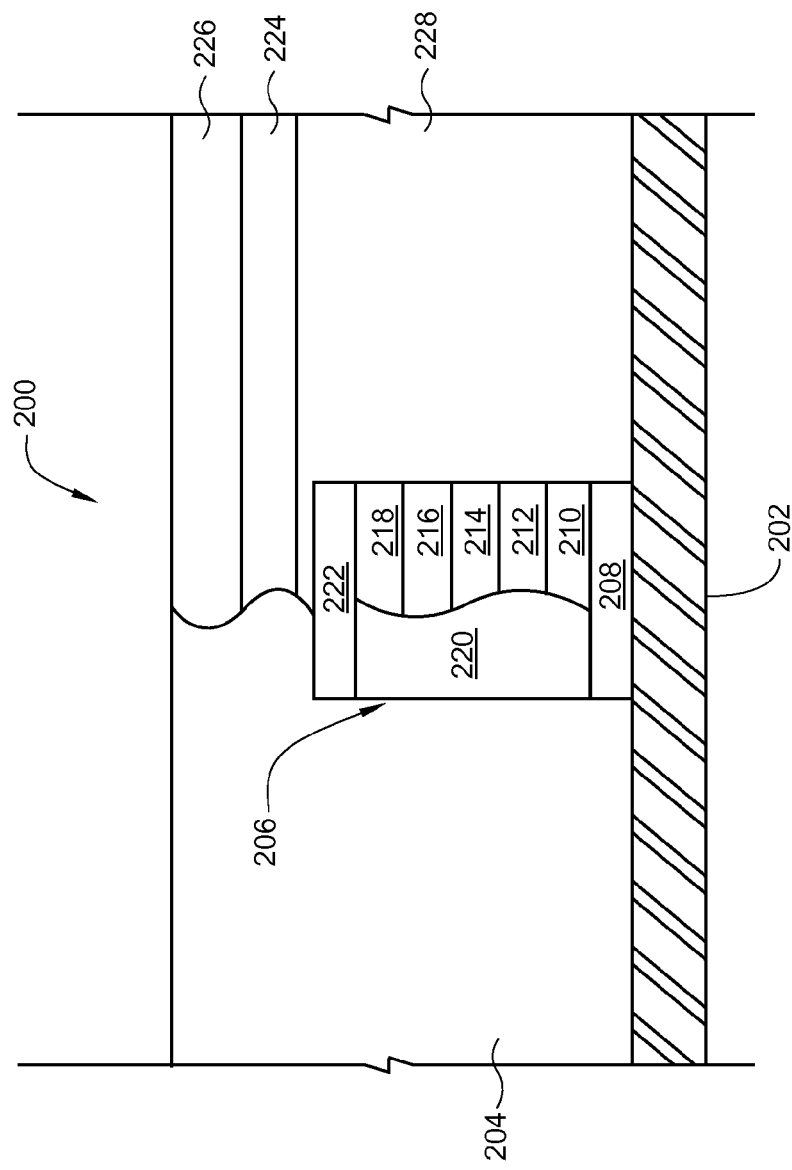
FIG. 2 is a cross-sectional schematic view of an organic semiconductor device with a multilayer barrier structure deposited on top according to one embodiment.

FIG. 2 depicts an organic semiconductor device, depicted here as an OLED device 200, with a multilayer barrier structure 204 deposited on top according to one embodiment. The multilayer barrier structure 204 can be deposited on the substrate 202 using methods described herein. In one embodiment, the anode layer 208 is deposited on the substrate 202. The substrate 202 in this embodiment can be a standard substrate used in deposition of thin films, such as a thin sheet of metal, organic material, silicon, glass, quartz, polymer materials or plastic, such as polyethylene terephthalate (PET) or polyethylene naphthalate (PEN). Further, any suitable substrate 202 size may be processed. An example of the anode layer 208 useable with one or more embodiments is an indium-tin-oxide (ITO). In one embodiment, the anode layer 208 can have a thickness of from about 200 Angstroms to about 2000 Angstroms.

After the anode layer 208, such as an indium tin oxide (ITO) layer, is deposited on the substrate 202, an organic stack 220 is deposited on the anode layer 208. The organic stack 220 can include a hole-injection layer 210, a hole-transport layer 212, an emissive layer 214, an electron-transport layer 216 and an electron injection layer 218. It should be noted that not all five layers are needed to build the organic stack 220 of the OLED device 206. In one embodiment, only a hole-transport layer 212 and an emissive layer 214 are used to form the organic stack 220. After deposition, the organic stack 220 is patterned.

After patterning surface of the organic stack 220, the cathode layer 222 is then deposited and patterned. The cathode layer 222 can be a metal, a mixture of metals or an alloy of metals. An example of the cathode material is an alloy of magnesium (Mg), silver (Ag), and aluminum (Al) in the thickness range of about 1000 Angstroms to about 3000 Angstroms.

The multilayer barrier structure 204 is deposited on top of the substrate surface after construction of the OLED device 206 is complete. In one embodiment, the multilayer barrier structure 204 includes an inorganic layer formed over the surface of the substrate. The inorganic layer 224 can be a thin layer of metal nitride film, metal oxide film or metal oxynitride film deposited in the thickness range of about 100 nm to about 5 μm, such as between about 100 nm to about 1 μm. The inorganic layer 224 is believed to provide particle coverage and create primary barrier layer, with a very low moisture and oxygen permeability. In one embodiment, silicon nitride (SiN), silicon oxynitride (SiON), silicon oxide (SiO), and silicon carbide (SiC), among others, can be used as the inorganic layer material.

One embodiment of the invention provides that the multilayer barrier structure 204 deposited on a substrate 201 includes one or more layers of barrier/encapsulating materials, comprising combinations of the inorganic layer 224, the metallic layer 226 and the organic layer 228. The inorganic layer 224 can be a metal oxide, a metal nitride or a metal oxynitride. Embodiments of the inorganic layer 224 can comprise silicon nitride, silicon oxide or silicon oxynitride. The inorganic layer 224 can be deposited using PECVD, such as CCP-PECVD or MW-PECVD, PVD or other known deposition techniques. The inorganic layer 224 can have a thickness of from 100 nm to 5 µm. In one embodiment, the inorganic layer 224 has a thickness of between 100 nm and 1 µm. The transparency of the inorganic layer 224 can be above 90%, such as above 95%.

An ALD layer can be deposited over the inorganic layer 224, described here as a metallic layer 226. The metallic layer 226 can be a metal oxide deposited by atomic layer deposition. The metallic layer 226 can include a metal selected from the group including Al, Hf, Ti, Zr, or Si. Examples of the metallic layer 226 can include aluminum oxide ($Al_2O_3$), hafnium boron oxide (HfBO), hafnium dioxide ($HfO_2$), titanium dioxide ($TiO_2$), zirconium dioxide ($ZrO_2$), or silicon oxide ($SiO_2$). The metallic layer 226 can comprise more than one layer. Further, each layer of the metallic layer 226 can be a composition which is different from any previous layer. Stated another way, the metallic layer 226 may be a composite of multiple ALD deposited layers wherein each ALD deposited layer includes a metal, a dopant or other components which differs from previous or subsequent layers. The metallic layer 226 can be from 5 Å to 100 Å thick.

Without being bound to any particular theory, it is believed that depositing a layer by ALD creates a very thin layer (between 1 Å and 10 Å) with few pores. Since ALD grown layers are known to be very conformal it is believed particles or defects can be capped and pores can be plugged using ALD layer, which may restricts water vapor or other components of the atmosphere to transfer through the layer. However, the ALD layer thickness can be more than a critical thickness limit to achieve good coverage and good barrier performance. Also since these ALD layers are almost defect free, it provides very effective barrier properties. By providing additional ALD layers which can be of the same or different composition, the barrier properties can be further improved.

Further, the ALD layer can be an ALD nanolaminate stack. The ALD nanolaminate stack can have multiple layers, such as two or more layers. The ALD nanolaminate stack can have a total thickness between 1 Å and 5000 Å, such as between. The ALD nanolaminate stack may include layers of different thicknesses (e.g. a first layer of 20 Å and a second layer of 40 Å) or the layers may be of a uniform thickness (e.g. a first, second and third layer, each layer having a thickness of 30 Å). The layers be made from a metal oxide or a metal oxynitride, such as $TiO_2$, $Al_2O_3$, $ZrO_2$, $HfO_2$ or other metal oxide. In another embodiment, the layers can be made from any ALD deposited oxide or oxynitride.

An organic layer can be optionally deposited over the OLED device 206. The organic layer 228 is shown in FIG. 2 as deposited under the inorganic layer 224, but this is not intended to be limiting. The organic layer 228 can optionally be deposited over the metallic layer 226, between the metallic layer 226 and the inorganic layer 224 or under the inorganic layer 224. The organic layer 228 can include various carbon-containing materials and polymer-type organic materials, e.g., amorphous carbon, diamond-like carbon, carbon-doped silicon containing material, etc. The organic layer 228 can enhance adhesion, soften the multilayer barrier structure 204 and decrease the effects of stress in other layers of the multilayer barrier structure 204.

One or more embodiments can include one or more second inorganic layers, one or more second metallic layers, one or more organic layers or combinations thereof (not shown). The inorganic, metallic and organic layers can have a different composition than the previous inorganic, metallic or organic layer respectively. The use of each layer and the order of that layer in the multilayer barrier structure 204 is generally related to the desired properties of the layer and can vary from operation to operation. In one embodiment, the multilayer barrier structure has a transparency of greater than 70%, such as a transparency of greater than 90%. In another embodiment, the multilayer barrier structure has a transparency of less than 90%.

Though the layers above are depicted as being deposited in a single order (organic layer, inorganic layer metallic layer), this order is not intended to be limiting. The layers may be deposited in any order, to fit the needs of the user. The inorganic layer is believed to provide particle coverage and act as a primary barrier layer. The inorganic layer is further believed to have a very low moisture and oxygen permeability. The metallic layer is believed to provide defect sealing in the inorganic layer and in underlying metallic layers, when more than one metallic layer is used. As such, the metallic layer acts as a secondary barrier layer which improves the permeability of the inorganic layer further making it a ultra-low permeability barrier. The organic layer is believed to act as a planarization layer, and also provides for barrier stack mechanical stability. As well, the organic layer decouples defects or pinholes in the metallic layer and the inorganic layer.

Figure 3:
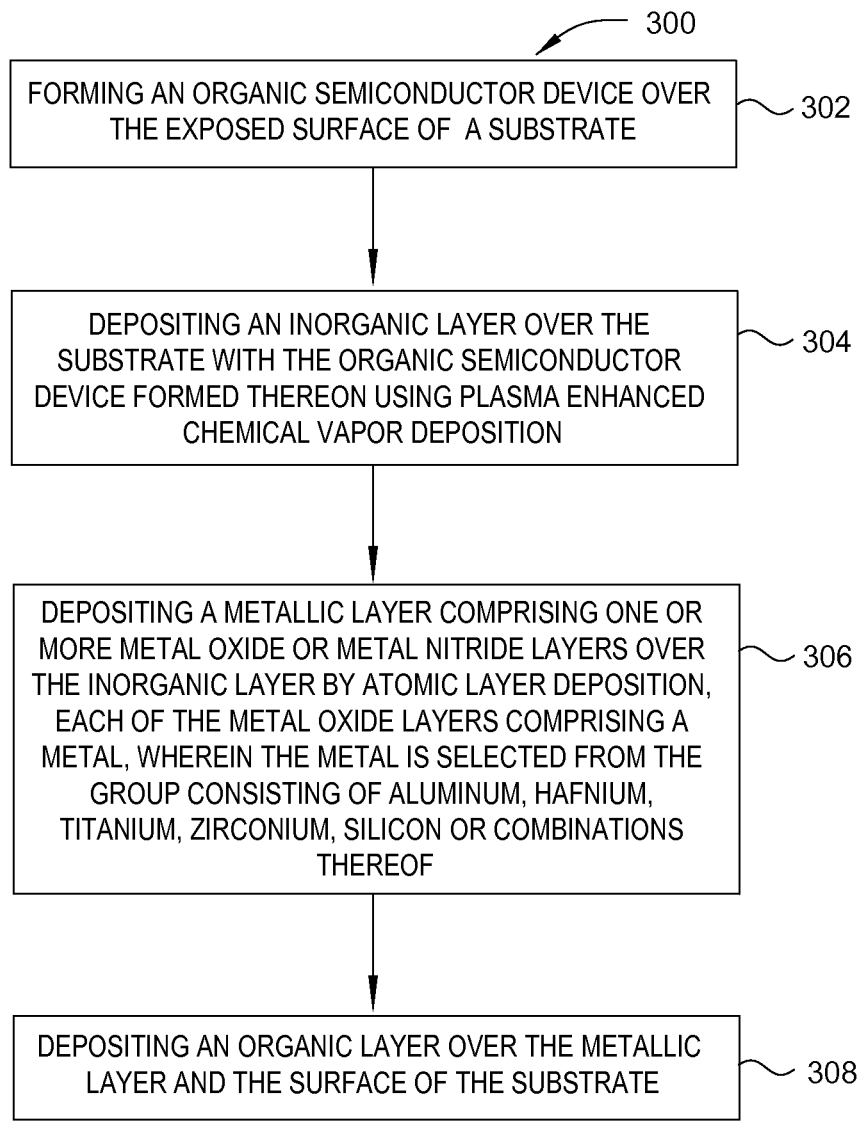
FIG. 3 is a flow diagram depicting a method of forming a multilayer barrier structure on a substrate according to one embodiment.

FIG. 3 is a flow diagram depicting a process 300 of forming a multilayer barrier structure on a substrate according to one embodiment. The process 300 begins with an organic semiconductor device being formed over the exposed surface of a substrate, as in step 302. At this step, the substrate is positioned on the substrate support assembly and moved into the processing region. Next, an organic semiconductor device, such as an OLED structure, is then formed on the surface of the positioned substrate. In one embodiment, the OLED structure comprises at least the hole-transport layer and the emissive layer along with the anode layer and the cathode layer, as described with reference to FIG. 2. However, the OLED structure can comprise all five layers as well as the anode and cathode layers described above or functional equivalents thereof.

An inorganic layer comprising a metal oxide, a metal nitride or a metal oxynitride can then be deposited over the substrate with the organic semiconductor device, as in 304. The inorganic layer can be deposited using plasma enhanced chemical vapor deposition (PECVD). As described above, the inorganic layer can be deposited to a thickness of from 100 nm to 5 um. The transparency of the layer can be greater than 90%. The inorganic layer can be selected from a variety of metal nitrides, metal oxides or metal oxynitrides with good water vapor transmission properties at a low thickness, such as silicon nitride. In one embodiment, the inorganic layer is silicon nitride with a water vapor transmission rate (WVTR) of about $1 \times 10^{-3}$ $g/m^2/day$ at a relative humidity of 85% and 85° C.

Not to be bound to any particular theory, satisfactory results can be achieved by a multilayer barrier structure layer with a WVTR of about $1 \times 10^{-6}$ $g/m^2/day$ or lower as deposited at a temperature lower than 100° C. Organic semiconductor devices are temperature sensitive in many cases and can require temperatures of less than 100° C. Barrier structures must be deposited after the organic semiconductor device. Therefore, the multilayer barrier structure should be deposited at temperatures below 100° C. to protect temperature sensitive embodiments.

A metallic layer comprising one or more metal oxide or metal nitride layers can then be deposited over the inorganic layer by atomic layer deposition, as in step 306. Each of the metal oxide layers can include a metal, wherein the metal is selected from the group consisting of aluminum, hafnium, titanium, zirconium, silicon, tungsten, tantalum, cobalt, manganese, tin, erbium, indium, niobium, barium, vanadium or combinations thereof. Possible metal nitride layers can include titanium nitride (TiN), tantalum nitride (TaN), aluminum nitride (AlN), tungsten nitride (WN), silicon nitride (SiN), cobalt nitride (CoN), manganese nitride (MnN), niobium nitride (NbN), and hafnium nitride (HfN). Possible metal oxide layers can include aluminum oxide ($Al_2O_3$), hafnium oxide ($HfO_2$), zirconium oxide ($ZrO_2$), titanium oxide ($TiO_2$), zinc oxide (ZnO), indium oxide ($In_2O_3$), tin oxide ($SnO_2$), indium tin oxide (ITO), tantalum oxide ($Ta_2O_5$), silicon oxide ($SiO_2$), erbium oxide ($Er_2O_3$), manganese oxide ($MnO_2$), niobium oxide ($Nb_2O_5$), nickel oxide ($NiO_2$), cobalt oxide ($CoO_2$), iron oxide ($Fe_2O_3$), vanadium oxide ($V_2O_5$) and barium titanium oxide ($BaTiO_3$). A variety of layers deposited by ALD can function as the metallic layer, so long as the deposition is defect free.

Moisture and atmospheric conditions are believed to be harmful to the organic semiconductor layer. However, removing water at low deposition temperatures (temperatures less than 100° C.) is very difficult. This leads to imperfect ALD layers with thermal ALD approach alone. PEALD can be used to excite various species such as oxygen, nitrogen and hydrogen radicals, which can be employed to broaden the range of ALD process chemistries. Metal oxide and metal nitride thin films can be deposited at low temperatures with activated species. The remote source enables processing of fragile substrates and delicate device structures without plasma damage due to very low ion count but still high reactive species flux.

An organic layer can be deposited over the metallic layer and the surface of the substrate, as in step 308. The organic layer 228 can be deposited using standard techniques known in the art such as CVD, inkjet printing, PVD, spray coating, blade or wire bar coating or any other coating method. In one embodiment, the organic layer is deposited by inkjet printing using an acrylate, a methacrylate, acrylic acid or combinations thereof. The organic layer can function to planarize the substrate, decoupling defects in deposited layers, sealing pinholes in underlying layers and react with and retain moisture or oxygen. In one embodiment, the organic layer is deposited with nanoparticles embedded therein. The nanoparticles can be composed of metal or metal oxides. The nanoparticles can act to retain moisture or oxygen. The organic layer can have a thickness of from 0.5 um to 50 um. Further, the organic layer can have a transparency of greater than 90%.

Modern organic semiconductor structures are sensitive to temperatures above 100 degrees Celsius. Since the barrier structure is deposited after the OLED structure is formed, the barrier structure is optimally deposited at temperatures which do not affect the function of the underlying organic semiconductor. In one embodiment, the encapsulation structure is deposited at temperatures below 90 degrees Celsius, such as temperatures of 85 degrees Celsius or less. By depositing the barrier structure using inorganic layers in conjunction with the ALD deposited metallic layers, permeability can be decreased while depositing layers at lower temperatures.

While the foregoing is directed to embodiments of the present invention, other and further embodiments of the invention may be devised without departing from the basic scope thereof, and the scope thereof is determined by the claims that follow.

The invention claimed is:

1. A thin multilayer barrier structure comprising:
   a non-conformal organic layer formed over an organic semiconductor device;
   an inorganic layer formed over the non-conformal organic layer and comprising a metal oxide, a metal nitride or a metal oxynitride;
   an ALD layer formed over the inorganic layer and comprising one or more oxide or nitride layers, each oxide or nitride layer comprising a metal, wherein the metal for each oxide or nitride layer is independently selected from the group consisting of Al, Hf, Ti, Zr, or and Si; and
   a second organic layer formed over the ALD layer.

2. The thin multilayer barrier structure of claim 1, wherein the inorganic layer comprises silicon oxynitride (SiON), silicon oxide (SiO), silicon carbide (SiC) or combinations thereof.

3. The thin multilayer barrier structure of claim 1, wherein the ALD layer comprises aluminum oxide ($Al_2O_3$), Hafnium boron oxide (HfBO), hafnium dioxide ($HfO_2$), titanium dioxide ($TiO_2$), Zirconium dioxide ($ZrO_2$), silicon oxide ($SiO_2$) or combinations thereof.

4. The thin multilayer barrier structure of claim 1, further comprising a second inorganic layer formed over the second organic layer and comprising a metal oxide, a metal nitride or a metal oxynitride.

5. The thin multilayer barrier structure of claim 1, wherein inorganic layer has a transparency greater than about 90%.

6. The thin multilayer barrier structure of claim 1, wherein the non-conformal organic layer, the inorganic layer, the ALD layer, and the second organic layer together have a transparency of greater than about 70%.

7. The thin multilayer barrier structure of claim 1, wherein the ALD layer is a nanolaminate stack comprising two or more oxide or nitride layers.

8. A thin multilayer barrier structure comprising:
   an inorganic layer formed over an organic semiconductor device comprising a metal oxide, a metal nitride or a metal oxynitride;
   a metallic layer formed over the inorganic layer and comprising two or more metal oxide or metal nitride layers, each metal oxide or metal nitride layer comprising a metal, wherein the metal for each metal oxide or metal nitride layer is selected from the group consisting of Al, Hf, Ti, Zr, and Si;
   an organic layer formed over the metallic layer;
   a second metallic layer formed over the organic layer and comprising one or more metal oxide or metal nitride layers, each metal oxide or metal nitride layer comprising a metal, wherein the metal for each metal oxide or metal nitride layer is selected from the group consisting of Al, Hf, Ti, Zr, and Si.

9. The thin multilayer barrier structure of claim 8, further comprising a second inorganic layer formed between the organic layer and the second metallic layer and comprising a metal oxide, a metal nitride or a metal oxynitride.

10. The thin multilayer barrier structure of claim 8, further comprising a second inorganic layer formed over the second metallic layer and comprising a metal oxide, a metal nitride or a metal oxynitride.

11. The thin multilayer barrier structure of claim 8, wherein the inorganic layer comprises silicon oxynitride (SiON), silicon oxide (SiO), silicon carbide (SiC) or combinations thereof.

12. The thin multilayer barrier structure of claim 8, wherein the inorganic layer has a transparency greater than about 90%.

13. The thin multilayer barrier structure of claim 8, wherein the inorganic layer, the metallic layer, the organic layer and the second metallic layer together have a transparency of greater than about 70%.

14. A method of depositing a thin multilayer barrier structure comprising:
   forming an organic semiconductor device over the exposed surface of a substrate;
   depositing an inorganic layer comprising a metal oxide, a metal nitride or a metal oxynitride over the substrate with the organic semiconductor device formed thereon using plasma enhanced chemical vapor deposition (PECVD);
   depositing a metallic layer comprising one or more metal oxide or metal nitride layers over the inorganic layer by atomic layer deposition, each of the metal oxide or metal nitride layers comprising a metal, wherein the metal is selected from the group consisting of aluminum, hafnium, titanium, zirconium, silicon or combinations thereof; and
   depositing an organic layer over the metallic layer and the surface of the substrate.

15. The method of claim 14, further comprising:
   depositing a second inorganic layer over the organic layer using PECVD; and
   depositing a second metallic layer comprising one or more metal oxide or metal nitride layers over the second inorganic layer by atomic layer deposition (ALD).

16. The method of claim 14, wherein either the inorganic layer or the second inorganic layer is deposited by microwave PECVD.

17. The method of claim 14, wherein the metallic layer comprises at least one layer of aluminum oxide ($Al_2O_3$).

18. The method of claim 14, wherein either the metallic layer or the second metallic layer is deposited by plasma enhanced ALD.

19. The method of claim 14, wherein the inorganic layer, the metallic layer and organic layer are deposited at a temperature of less than 100 degrees Celsius.

20. The method of claim 14, wherein the organic layer comprises nanoparticles.

* * * * *